US011766759B2

(12) United States Patent
Heo et al.

(10) Patent No.: US 11,766,759 B2
(45) Date of Patent: Sep. 26, 2023

(54) POROUS POLYURETHANE POLISHING PAD AND PROCESS FOR PRODUCING THE SAME

(71) Applicant: SK enpulse Co., Ltd., Gyeonggi-do (KR)

(72) Inventors: Hye Young Heo, Gyeonggi-do (KR); Jang Won Seo, Busan (KR); Jong Wook Yun, Gyeonggi-do (KR); Sunghoon Yun, Gyeonggi-do (KR); Jaein Ahn, Gyeonggi-do (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 940 days.

(21) Appl. No.: 16/389,711

(22) Filed: Apr. 19, 2019

(65) Prior Publication Data

US 2019/0321937 A1 Oct. 24, 2019

(30) Foreign Application Priority Data

Apr. 20, 2018 (KR) .................. 10-2018-0046215

(51) Int. Cl.
| | |
|---|---|
| B24B 37/24 | (2012.01) |
| B24B 37/26 | (2012.01) |
| B24D 18/00 | (2006.01) |
| B29C 39/00 | (2006.01) |
| B29C 39/02 | (2006.01) |
| C08G 18/08 | (2006.01) |
| C08G 18/10 | (2006.01) |
| C08G 18/32 | (2006.01) |
| C08G 18/76 | (2006.01) |
| C08J 5/18 | (2006.01) |
| C08J 9/00 | (2006.01) |
| C08J 9/04 | (2006.01) |
| C08J 9/12 | (2006.01) |
| C08J 9/236 | (2006.01) |
| C08J 9/32 | (2006.01) |
| C08L 75/04 | (2006.01) |
| C09D 175/04 | (2006.01) |
| H01L 21/321 | (2006.01) |

(52) U.S. Cl.
CPC ............ *B24B 37/24* (2013.01); *C08J 9/32* (2013.01); *C08G 18/10* (2013.01); *C08G 18/14* (2013.01); *C08J 2375/04* (2013.01); *H01L 21/3212* (2013.01)

(58) Field of Classification Search
CPC . B24B 37/24; C08J 9/32; C08G 18/10; C08G 18/14
See application file for complete search history.

(56) References Cited

U.S. PATENT DOCUMENTS

| | | | | |
|---|---|---|---|---|
| 10,513,007 | B2 * | 12/2019 | Ahn | .................... H01L 21/3212 |
| 10,518,383 | B2 * | 12/2019 | Ahn | ................... H01L 21/30625 |
| 2006/0226567 | A1 * | 10/2006 | James | ....................... B29B 7/90 |
| | | | | 264/102 |
| 2015/0065014 | A1 * | 3/2015 | Jensen | ...................... B24B 1/00 |
| | | | | 451/41 |
| 2017/0014970 | A1 * | 1/2017 | Itoyama | ............. C08G 18/3243 |
| 2019/0061097 | A1 * | 2/2019 | Seo | ......... C08J 9/0052 |
| 2019/0314954 | A1 * | 10/2019 | Heo | ..................... B24D 11/005 |
| 2019/0329376 | A1 * | 10/2019 | Heo | ........................ C08G 18/10 |
| 2021/0229237 | A1 * | 7/2021 | Seo | .................... C08G 18/4854 |

FOREIGN PATENT DOCUMENTS

| | | | |
|---|---|---|---|
| KR | 10-1996-0703974 | | 8/1996 |
| KR | 10-2016-0027075 | | 3/2016 |
| KR | 10-1835087 | | 3/2018 |
| KR | 101835087 B1 * | 3/2018 | |
| KR | 101835090 B1 * | 3/2018 | |
| TW | 200709891 | | 3/2007 |
| TW | 200940613 | | 10/2009 |
| WO | WO-2015151784 A1 * | 10/2015 | ............. B24B 37/24 |

OTHER PUBLICATIONS

Office Action issued by the Korean Intellectual Property Office dated Jun. 19, 2019.
Office Action issued by the Taiwanese Patent Office dated Nov. 27, 2019.
Fu, L et al., Preparation and Properties of Polyurethane Elastomer Material With High Voltage Resistant, Liaoning Chemical Industry, Apr. 2013, pp. 333-335, vol. 42, No. 4.
Office Action issued by the Chinese Patent Office dated Dec. 2, 2020.

* cited by examiner

*Primary Examiner* — Melissa A Rioja
(74) *Attorney, Agent, or Firm* — IP & T GROUP LLP (57) ABSTRACT

Embodiments relate to a porous polyurethane polishing pad for use in a chemical mechanical planarization (CMP) process of semiconductors and a process for preparing the same. According to the embodiments, the size and distribution of the plurality of pores contained in the porous polyurethane polishing pad can be adjusted. Thus, it is possible to provide a porous polyurethane polishing pad that has enhanced physical properties such as a proper level of withstand voltage, excellent polishing performance (i.e., polishing rate), and the like.

14 Claims, 3 Drawing Sheets

FIG. 7

POROUS POLYURETHANE POLISHING PAD AND PROCESS FOR PRODUCING THE SAME

The present application claims priority of Korean patent application number 10-2018-0046215 filed on Apr. 20, 2018, which is incorporated herein by reference in its entirety.

TECHNICAL FIELD

Embodiments relate to a porous polyurethane polishing pad for use in a chemical mechanical planarization (CMP) process of semiconductors and a process for preparing the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by supplying a slurry while the platen and the head are relatively moved to thereby mechanically planarize the irregularities on the wafer surface.

A polishing pad is an essential member that plays an important role in such a CMP process. In general, a polishing pad is composed of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

First, as the solid phase foaming agent, microcapsules (i.e., thermally expanded microcapsules), whose size has been adjusted by a thermal expansion, are used. Since the thermally expanded microcapsules in a structure of already expanded micro-balloons have a uniform particle diameter, the diameter of pores can be uniformly controlled. However, the thermally expanded microcapsules have a problem in that it is difficult to control the pores to be formed since the shape of the microcapsules changes under the reaction condition of a high temperature of 100° C. or higher.

Meanwhile, the technique of forming pores using an inert gas or a volatile liquid phase foaming agent has the advantage that any material that may affect the CMP process is not discharged. However, it is difficult to precisely control the size of pores and the density of the pad since it is inevitable to deal with a gas phase, which is not conveniently controlled. It is particularly difficult to produce uniform pores of 50 μm or less. In addition, there is a problem that it is very difficult to control the size of pores and the density of the pad without changing the composition of the polyurethane matrix of a polishing pad.

Accordingly, although pores can be formed in conformation with the size and distribution as designed when micropores are implemented using a single foaming agent as in the conventional processes, the degree of freedom in designing the pores is low, and there is a limit in controlling the pore distribution.

Meanwhile, Korean Laid-open Patent Publication No. 2016-0027075 discloses a process for producing a low-density polishing pad using an inert gas and a pore inducing polymer, and a low-density polishing pad. However, this publication fails to teach the adjustment of the size and distribution of pores and the polishing rate and breakdown voltage of the polishing pad.

PRIOR ART DOCUMENT

Patent Document (Patent Document 1) Korean Laid-open Patent Publication No. 2016-0027075

DISCLOSURE OF THE INVENTION

Technical Problem

Accordingly, it is an object of the embodiments to provide a porous polyurethane polishing pad having pores whose size and distribution are controlled, whereby the breakdown voltage and polishing rate thereof are enhanced, and a process for preparing the same.

Solution to the Problem

In order to achieve the above object, an embodiment provides a porous polyurethane polishing pad, which comprises a urethane-based resin, a curing agent, and a plurality of pores,
wherein the plurality of pores have an area-weighted average pore diameter (AWAPD) of 10 μm to 40 μm, and
the porous polyurethane polishing pad has a thickness of 1.5 mm to 2.5 mm, a specific gravity of 0.7 $g/cm^3$ to 0.9 $g/cm^3$, a surface hardness at 25° C. of 50 shore D to 65 shore D, a tensile strength of 15 $N/mm^2$ to 25 $N/mm^2$, an elongation of 80% to 250%, a total pore area of 30% to 60% based on the total area of the polishing pad, and a breakdown voltage of 14 kV to 23 kV.

In order to achieve the above object, an embodiment provides a process for preparing a porous polyurethane polishing pad, which comprises
(1) injecting a mixture comprising a urethane-based prepolymer, a curing agent, and a material for forming a plurality of pores into a mold and molding it; and
(2) curing the mixture,
wherein the plurality of pores have an area-weighted average pore diameter (AWAPD) of 10 μm to 40 μm, and
the porous polyurethane polishing pad has a thickness of 1.5 mm to 2.5 mm, a specific gravity of 0.7 $g/cm^3$ to 0.9 $g/cm^3$, a surface hardness at 25° C. of 50 shore D to 65 shore D, a tensile strength of 15 $N/mm^2$ to 25 $N/mm^2$, an elongation of 80%/o to 250%, a total pore area of 30% to 60% based on the total area of the polishing pad, and a breakdown voltage of 14 kV to 23 kV.

Advantageous Effects of the Invention

According to the embodiments, the size and distribution of the plurality of pores contained in the porous polyurethane polishing pad can be adjusted. Thus, it is possible to provide a porous polyurethane polishing pad that has enhanced physical properties such as a proper level of withstand voltage, excellent polishing performance (i.e., polishing rate), and the like. In particular, the porous polyurethane polishing pad has pores of a relatively large pore diameter uniformly arranged over the entire polishing pad and small pores arranged between the large pores. Thus, the porous polyurethane polishing pad has a structure in which void spaces formed by the pores and a polyurethane matrix are uniformly distributed. As a result, the porous polyurethane polishing pad hardly has a region having a lot of pores and a region having almost no pores. Thus, the polishing pad can prevent scratches or the like that may be generated on an object to be polished such as a wafer.

DETAILED DESCRIPTION FOR CARRYING OUT THE INVENTION

Description of Terms

Unless otherwise stated or defined, all technical and scientific terms used herein have the same meaning as commonly understood by one of ordinary skill in the art to which this invention pertains.

Unless otherwise stated, all percentages, parts, and ratios are by weight.

All numerical ranges related to the quantities of components, physical properties such as molecular weight, reaction conditions, and the like used herein in all circumstances are to be understood as being modified by the term "about."

In this specification, when a part is referred to as "comprising" an element, it is to be understood that it may comprise other elements as well, rather than excluding the other elements, unless specifically stated otherwise.

The term "plurality of" as used herein refers to more than one.

In this specification, the terms "porous polyurethane polishing pad" and "polishing pad" are used interchangeably.

Hereinafter, the present invention is explained in detail by the following embodiments. The embodiments can be modified into various forms as long as the gist of the invention is not changed.

Porous Polyurethane Polishing Pad

An embodiment provides a porous polyurethane polishing pad, which comprises a urethane-based resin, a curing agent, and a plurality of pores, wherein the plurality of pores have an area-weighted average pore diameter (AWAPD) of 10 μm to 40 μm, and the porous polyurethane polishing pad has a thickness of 1.5 mm to 2.5 mm, a specific gravity of 0.7 g/cm$^3$ to 0.9 g/cm$^3$, a surface hardness at 25° C. of 50 shore D to 65 shore D, a tensile strength of 15 N/mm$^2$ to 25 N/mm$^2$, an elongation of 80% to 250%, a total pore area of 30% to 60% based on the total area of the polishing pad, and a breakdown voltage of 14 kV to 23 kV.

Plurality of Pores

The plurality of pores contained in the porous polyurethane polishing pad according to the embodiment are present as dispersed in the polyurethane resin.

Meanwhile, the plurality of pores have an area-weighted average pore diameter (AWAPD) of 10 μm to 40 μm. The AWAPD is a value calculated according to the above Equation 1.

Area-weighted average pore diameter (AWAPD)= Σpore diameter×area ratio of pores having the pore diameter (%)/100     [Equation 1]

Specifically, the AWAPD may be 10 μm to 30 μm. More specifically, the AWAPD may be 12 μm to 25 μm. Even more specifically, the AWAPD may be 14 μm to 22 μm. But it is not limited thereto.

In an embodiment, when the AWAPD is X, the sum of the cross-sectional areas of first pores having a diameter of less than X−5 μm in the diameter distribution of the plurality of pores based on the cross-sectional area of the plurality of porous polyurethane polishing pad may be 5% to 45% based on 100% of the sum of the cross-sectional areas of the plurality of pores. Specifically, the sum of the cross-sectional areas of the first pores having a diameter of less than X−5 μm may be 10% to 40%. More specifically, the sum of the cross-sectional areas of the first pores having a diameter of less than X−5 μm may be 20% to 30%. But it is not limited thereto.

In addition, the sum of the cross-sectional areas of second pores having a diameter of greater than X+5 μm may be 10% to 45%. Specifically, the sum of the cross-sectional areas of the second pores having a diameter of greater than X+5 μm may be 10% to 40%. More specifically, the sum of the cross-sectional areas of the second pores having a diameter of greater than X+5 μm may be 20% to 30%. But it is not limited thereto.

In addition, the sum of the cross-sectional areas of the plurality of pores having a diameter of greater than X+10 μm may be 3% to 35%. Specifically, the sum of the cross-sectional areas of the plurality of pores having a diameter of greater than X+10 μm may be 5% to 20%. More specifically, the sum of the cross-sectional areas of the plurality of pores having a diameter of greater than X+10 μm may be 5% to 15%. But it is not limited thereto.

In addition, the sum of the cross-sectional areas of the plurality of pores having a diameter of greater than X+20 μm may be 1% to 15%. Specifically, the sum of the cross-sectional areas of the plurality of pores having a diameter of greater than X+20 μm may be 1% to 10%. But it is not limited thereto.

In addition, the pore distribution of the porous polyurethane polishing pad may have a first peak diameter with the highest distribution ratio.

Figure 5:
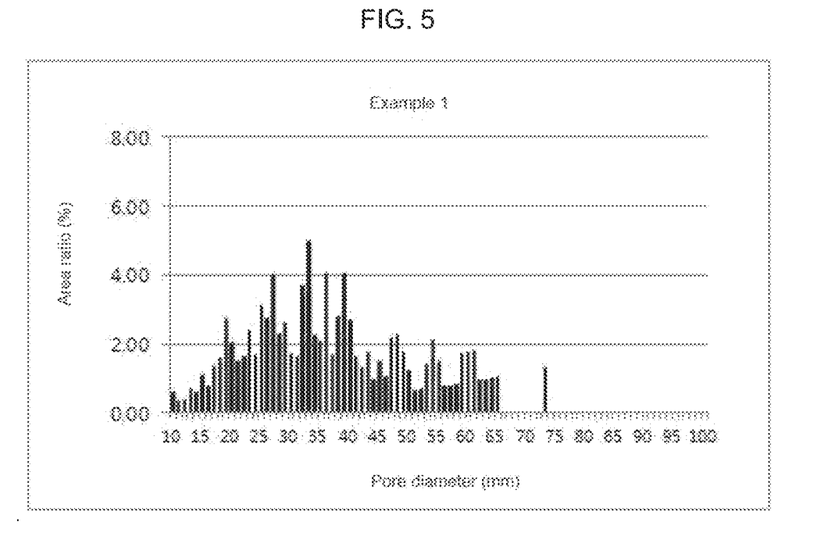
FIGS. 5 to 7 are graphs showing the pore diameter distribution of each of the polishing pads of Examples 1 and 2 and that of Comparative Example 1 based on the area, respectively.
Figure 6:
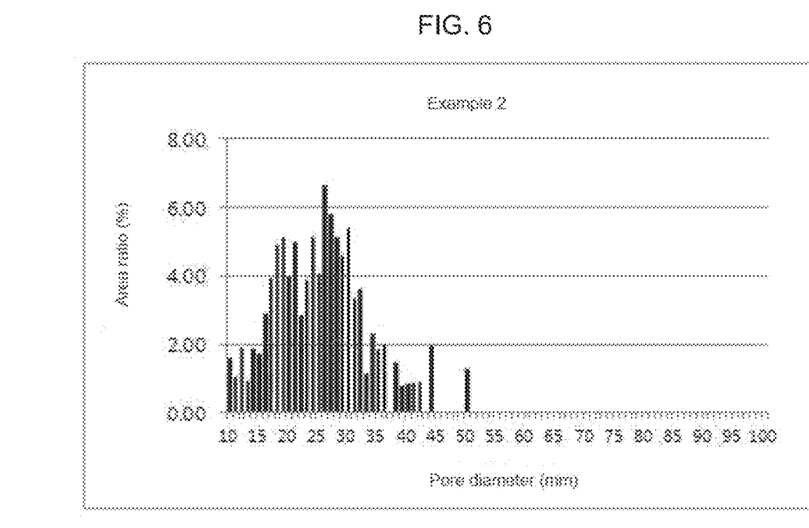

Referring to FIGS. 5 and 6, in the diameter distribution of the pores based on 100% of the sum of the cross-sectional areas of the pores contained in the porous polyurethane polishing pad, the pore diameter of the maximum peak may be 50 μm or less, specifically μm or less, more specifically 15 μm to 40 μm, even more specifically 25 μm to 35 μm or 26 μm to 33 μm. But it is not limited thereto.

In an embodiment, when the diameter of the maximum peak is Y, the sum of the cross-sectional areas of pores having a diameter of Y−5 μm or less in the diameter distribution of the plurality of pores based on the cross-sectional area of the plurality of porous polyurethane polishing pad may be 20% to 40% based on 100% of the sum of the cross-sectional areas of the plurality of pores. More specifically, the sum of the cross-sectional areas of the pores having a diameter of Y−5 μm or less may be 30% to 35%. But it is not limited thereto.

In addition, the sum of the cross-sectional areas of pores having a diameter of Y−10 μm or less may be 5% to 30%. Specifically, the sum of the cross-sectional areas of the pores having a diameter of Y−10 μm or less may be 10%0 to 20%. More specifically, the sum of the cross-sectional areas of the pores having a diameter of Y−10 μm or less may be 11% to 18%. But it is not limited thereto.

As described above, since the porous polyurethane polishing pad according to the embodiment uniformly contains small diameter pores and large diameter pores, it may have appropriate breakdown voltage and enhanced polishing performance.

Meanwhile, the plurality of pores may be derived from a mixture of at least two solid phase foaming agents. Specifically, they may be derived from a mixture of at least three solid phase foaming agents. More specifically, they may be derived from a mixture of at least four solid phase foaming agents. But they are not limited thereto. The mixture of solid phase foaming agents may be a mixture of at least two, at least three, or at least four solid phase foaming agents having different average particle diameter distributions.

Meanwhile, the plurality of pores may be derived from at least one solid phase foaming agent and at least one inert gas. Specifically, the at least one solid phase foaming agent may be at least two, at least three, or at least four solid phase foaming agents. The at least one inert gas may be at least two, at least three, or at least four inert gases.

The kind of the inert gas is not particularly limited as long as it is a gas that does not participate in the reaction between a urethane-based resin and a curing agent. For example, the inert gas may be at least one selected from the group consisting of nitrogen gas ($N_2$), argon gas (Ar), and helium (He). Specifically, the inert gas may be nitrogen gas ($N_2$) or argon gas (Ar).

The solid phase foaming agent may be thermally expanded (i.e., size-controlled) microcapsules. The thermally expanded (i.e., size-controlled) microcapsules may be obtained by thermally expanding thermally expandable microcapsules. The thermally expandable microcapsules may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic copolymer. Further, the foaming agent encapsulated in the inside may be at least one selected from the group consisting of hydrocarbons having 1 to 7 carbon atoms. Specifically, the foaming agent encapsulated in the inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

In addition, the solid phase foaming agent is thermally expanded microcapsules and may have a structure of microballoons having an average particle diameter of 5 μm to 200 μm. Specifically, the solid phase foaming agent may have an average particle diameter of 10 μm to 50 μm. More specifically, the solid phase foaming agent may have an average particle diameter of 15 μm to 45 μm. In addition, the thermally expanded microcapsules may be obtained by thermally expanding thermally expandable microcapsules.

Urethane-Based Resin

The porous polyurethane polishing pad comprises a urethane-based resin, specifically a polyurethane resin. The polyurethane resin may be derived from a urethane-based prepolymer having an isocyanate terminal group. In such event, the polyurethane resin comprises monomer units that constitute the prepolymer.

A prepolymer generally refers to a polymer having a relatively low molecular weight wherein the degree of polymerization is adjusted to an intermediate level for the sake of conveniently molding a product in the process of producing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenyl methane diisocyanate, hexamethylene diisocyanate, dicyclohexylmethane diisocyanate, and isophorone diisocyanate. But it is not limited thereto.

For example, the polyol that may be used in the preparation of the urethane-based prepolymer may be at least one polyol selected from the group consisting of a polyether polyol, a polyester polyol, a polycarbonate polyol, and an acryl polyol. But it is not limited thereto. The polyol may have a weight average molecular weight (Mw) of 300 g/mole to 3,000 g/mole.

The urethane-based resin may have a weight average molecular weight of 500 g/mole to 3,000 g/mole. Specifically, the urethane-based resin may have a weight average molecular weight (Mw) of 600 g/mole to 2,000 g/mole or 700 g/mole to 1,500 g/mole.

Curing Agent

The curing agent may comprise an amine compound, an alcohol compound, or a combination thereof. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

Reaction Rate Controlling Agent

If desired, the porous polyurethane polishing pad may further comprise a reaction rate controlling agent. The reaction rate controlling agent may be at least one selected from the group consisting of a tertiary amine-based compound and an organometallic compound. Specifically, the reaction rate controlling agent may be a reaction promoter or a reaction retarder. More specifically, the reaction rate controlling agent may be a reaction promoter.

For example, the reaction rate controlling agent may comprise at least one selected from the group consisting of diethylene diamine (TEDA), dimethyl ethanol amine (DMEA), tetramethyl butane diamine (TMBDA), 2-methyltriethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may be at least one selected from the group consisting of benzyldimethyl amine, N,N-dimethylcyclohexyl amine, and triethylamine.

Silicone-Based Surfactant

If desired, the porous polyurethane polishing pad may further comprise a silicone-based surfactant. The silicone-based surfactant may act to prevent the pores to be formed from overlapping and coalescing with each other. The surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is excellent in compatibility with an isocyanate-containing compound and an active hydrogen compound. Examples of the silicone-based nonionic surfactant having a hydroxyl group, which is commercially available, include DOW CORNING 193 (a silicone glycol copolymer in a liquid phase having a specific gravity at 25° C. of 1.07, a viscosity at 20° C. of 465 mm$^2$/s, and a flash point of 92° C.) (hereinafter referred to as DC-193) manufactured by Dow Corning.

Examples of the silicone-based nonionic surfactant having no hydroxyl group, which is commercially available, include DOW CORNING 190 (a silicone glycol copolymer having a Gardner color number of 2, a specific gravity at 25° C. of 1.037, a viscosity at 25° C. of 2,000 mm$^2$/s, a flash point of 63° C. or higher, and an inverse solubility point (1.0% water solution) of 36° C. (hereinafter referred to as DC-190) manufactured by Dow Corning.

Physical Properties of the Porous Polyurethane Polishing Pad

The porous polyurethane polishing pad according to the embodiment may have a number of pores of 500 or more per unit area (mm$^2$) thereof. Specifically, the porous polyurethane polishing pad according to the embodiment may have a number of pores of 150 or more, more specifically 200 or more, per unit area (mm$^2$) thereof. But it is not limited thereto. Meanwhile, the porous polyurethane polishing pad may have a number of pores of 1,500 or less per unit area (mm$^2$) thereof. Thus, the porous polyurethane polishing pad may have a number of pores of 500 to 1,500, specifically 700 to 1,500, more specifically 800 to 1,450, per unit area (mm$^2$) thereof. But it is not limited thereto.

In addition, the porous polyurethane polishing pad according to the embodiment is excellent in the basic physical properties of a polishing pad such as specific gravity, surface hardness, tensile strength, elongation, and breakdown voltage.

The physical properties of the porous polyurethane polishing pad such as specific gravity and hardness can be controlled through the molecular structure of the urethane-based resin polymerized by the reaction between an isocyanate and a polyol.

With respect to specific gravity, the porous polyurethane polishing pad may have a specific gravity of 0.6 g/cm$^3$ to 0.9 g/cm$^3$. Specifically, the porous polyurethane polishing pad may have a specific gravity of 0.7 g/cm$^3$ to 0.9 g/cm$^3$. More specifically, the porous polyurethane polishing pad may have a specific gravity of 0.7 g/cm$^3$ to 0.85 g/cm$^3$. But it is not limited thereto.

With respect to surface hardness, the porous polyurethane polishing pad may have a hardness at 25° C. of 30 Shore D to 80 Shore D. More specifically, the porous polyurethane polishing pad may have a hardness of 40 Shore D to 70 Shore D. Even more specifically, the porous polyurethane polishing pad may have a hardness of 50 Shore D to 65 Shore D. But it is not limited thereto.

With respect to elongation, the porous polyurethane polishing pad may have an elongation of 30% to 300%. More specifically, the porous polyurethane polishing pad may have an elongation of 50% to 250%. Even more specifically, the porous polyurethane polishing pad may have an elongation of 80% to 250%. But it is not limited thereto.

With respect to withstand voltage, the porous polyurethane polishing pad may have a breakdown voltage of 14 kV or more. Specifically, the porous polyurethane polishing pad may have a breakdown voltage of 14 kV to 23 kV. More specifically, the porous polyurethane polishing pad may have a breakdown voltage of 14 kV to 22 kV.

With respect to total pore area, the porous polyurethane polishing pad may have a total pore area of 30% to 60% based on the total area of the polishing pad. Specifically, the porous polyurethane polishing pad may have a total pore area of 30% to 50% based on the total area of the polishing pad. More specifically, the porous polyurethane polishing pad may have a total pore area of 40% to 50% based on the total area of the polishing pad.

With respect to thickness, the porous polyurethane polishing pad may have a thickness of 1 mm to 5 mm. Specifically, the porous polyurethane polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm. If the thickness of the porous polyurethane polishing pad is within the above range, the basic physical properties of the polishing pad can be sufficiently exhibited.

The porous polyurethane polishing pad may have grooves on its surface for mechanical polishing. The grooves may have a depth, a width, and a spacing as desired for mechanical polishing, which are not particularly limited.

The porous polyurethane polishing pad according to the embodiment may simultaneously have the physical properties of the polishing pad as described above. For example, the porous polyurethane polishing pad according to the embodiment may have a thickness of 1.5 mm to 2.5 mm, a specific gravity of 0.7 g/cm$^3$ to 0.9 g/cm$^3$, a surface hardness at 25° C. of 50 shore D to 65 shore D, a tensile strength of 15 N/mm$^2$ to 25 N/mm$^2$, an elongation of 80% to 250%, a total pore area of 30% to 60% based on the total area of the polishing pad, and a breakdown voltage of 14 kV to 23 kV. But it is not limited thereto.

That is, the porous polyurethane polishing pad according to the embodiment has pores of an appropriate size distribution, and the pores are uniformly distributed throughout the polishing pad to provide the average pore diameter, specific gravity, surface hardness, tensile strength, elongation, and breakdown voltage characteristics as described above. That is, the polishing pad has pores of a relatively large pore diameter uniformly arranged and small pores arranged between the large pores. Thus, the polishing pad has a structure in which void spaces formed by the pores and a polyurethane matrix are uniformly distributed. As a result, the polishing pad hardly has a region having a lot of pores and a region having almost no pores. Thus, the polishing pad can prevent scratches or the like that may be generated on an object to be polished such as a wafer.

Process for Preparing a Porous Polyurethane Polishing Pad

According to an embodiment, there is provided a process for preparing a porous polyurethane polishing pad, which comprises (1) injecting a mixture comprising a urethane-based prepolymer, a curing agent, and a material for forming a plurality of pores into a mold and molding it; and (2) curing the mixture, wherein the plurality of pores have an area-weighted average pore diameter (AWAPD) of 10 μm to 40 μm, and the porous polyurethane polishing pad has a thickness of 1.5 mm to 2.5 mm, a specific gravity of 0.7 g/cm$^3$ to 0.9 g/cm$^3$, a surface hardness at 25° C. of 50 shore D to 65 shore D, a tensile strength of 15 N/mm$^2$ to 25 N/mm$^2$, an elongation of 80% to 250%, a total pore area of 30% to 60% based on the total area of the polishing pad, and a breakdown voltage of 14 kV to 23 kV.

The plurality of pores are as described above in the section of the porous polyurethane polishing pad.

Specifically, the material for forming the plurality of pores may be a mixture of at least two solid phase foaming agents. Alternatively, it may be at least one solid phase foaming agent and at least one inert gas. The mixture of solid phase foaming agents may be a mixture of at least two solid phase foaming agents having different average particle diameter distributions.

The solid phase foaming agent and the inert gas are as described above in the section of the porous polyurethane polishing pad.

Hereinafter, the process for preparing a porous polyurethane polishing pad will be described in detail.

Supply of Raw Materials

A urethane-based prepolymer, a curing agent, and a material for forming a plurality of pores are prepared as raw materials. The urethane-based prepolymer and the curing agent are as described above in the section of the porous polyurethane polishing pad.

Meanwhile, in the case where the material for forming a plurality of pores is a mixture of at least two solid phase foaming agents, the mixture, which comprises the urethane-based prepolymer, the curing agent, and the material for forming a plurality of pores, may comprise 0.5 to 10 parts by weight of the mixture of solid phase foaming agents per 100 parts by weight of the urethane-based prepolymer. More specifically, the raw material mixture may comprise 1 part by weight to 7 parts by weight of the mixture of solid phase foaming agents per 100 parts by weight of the urethane-based prepolymer. Even more specifically, the raw material mixture may comprise 3 parts by weight to 6 parts by weight of the mixture of solid phase foaming agents per 100 parts by weight of the urethane-based prepolymer.

On the other hand, in the case where the material for forming a plurality of pores is at least one solid phase foaming agent and at least one inert gas, the inert gas may be added during the mixing and reaction of the urethane-based prepolymer, the curing agent, and the solid phase foaming agent to thereby form pores in the polishing pad.

The inert gas may be added in an amount of 20% by volume to 35% by volume, specifically 20% by volume to 30% by volume, based on the total volume of the urethane-based prepolymer, the curing agent, and the solid phase foaming agent.

If desired, the mixture may further comprise a reaction rate controlling agent. The reaction rate controlling agent is as described above in the section of the porous polyurethane polishing pad.

The reaction rate controlling agent may be employed in an amount of 0.1 part by weight to 2 parts by weight based on 100 parts by weight of the urethane-based prepolymer. Specifically, the reaction rate controlling agent may be employed in an amount of 0.2 part by weight to 1.8 parts by weight, 0.2 part by weight to 1.7 parts by weight, 0.2 part by weight to 1.6 parts by weight, or 0.2 part by weight to 1.5 parts by weight, based on 100 parts by weight of the urethane-based prepolymer. If the reaction rate controlling agent is employed in an amount within the above range, the reaction rate (i.e., time for solidification) of the mixture (i.e., the urethane-based prepolymer, the curing agent, the (mixture of) solid phase foaming agent(s), the reaction rate controlling agent, and a silicone surfactant) is properly controlled, so that a polishing pad having pores of a desired size can be produced.

If desired, the mixture may further comprise a surfactant. The surfactant is as described above in the section of the porous polyurethane polishing pad.

The surfactant may be employed in an amount of 0.2 part by weight to 2 parts by weight based on 100 parts by weight of the urethane-based prepolymer. Specifically, the surfactant may be employed in an amount of 0.2 part by weight to 1.9 parts by weight, 0.2 part by weight to 1.8 parts by weight, 0.2 part by weight to 1.7 parts by weight, 0.2 part by weight to 1.6 parts by weight, or 0.2 part by weight to 1.5 parts by weight, based on 100 parts by weight of the urethane-based prepolymer. If the amount of the surfactant is within the above range, pores derived from the inert gas can be stably formed and maintained in the mold.

As an example, the urethane-based prepolymer, the curing agent, the material for forming a plurality of pores, the reaction rate controlling agent, and the surfactant may be put into the mixing process substantially at the same time.

As another example, the urethane-based prepolymer, the (mixture) of solid phase foaming agent(s), and the surfactant may be mixed in advance, and the curing agent, the reaction rate controlling agent, and the inert gas may be subsequently introduced.

The mixing initiates the reaction of the urethane-based prepolymer and the curing agent by mixing them and uniformly disperses the material for forming a plurality of pores in the raw materials. In such event, the reaction rate controlling agent may intervene in the reaction between the urethane-based prepolymer and the curing agent from the beginning of the reaction, to thereby control the reaction rate. Specifically, the mixing may be carried out at a speed of 1,000 rpm to 10,000 rpm or 4,000 rpm to 7,000 rpm. Within the above speed range, it may be more advantageous for the material for forming a plurality of pores to be uniformly dispersed in the raw materials.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Reaction and Formation of Pores

The urethane-based prepolymer and the curing agent react with each other upon the mixing thereof to form a solid polyurethane, which is then formed into a sheet or the like. Specifically, the isocyanate terminal group in the urethane-based prepolymer can react with the amine group, the alcohol group, and the like in the curing agent. In such event, the inert gas and the (mixture of) solid phase foaming agent(s) are uniformly dispersed in the raw materials to form pores without participating in the reaction between the urethane-based prepolymer and the curing agent.

In addition, the reaction rate controlling agent, if employed, adjusts the size of the pores by promoting or retarding the reaction between the urethane-based prepolymer and the curing agent. For example, if the reaction rate controlling agent is a reaction retarder for delaying the reaction, the time for which the inert gas finely dispersed in the raw materials are combined with each other is prolonged, so that the average diameter of the pores can be increased. On the other hand, if the reaction rate controlling agent is a reaction promoter for expediting the reaction, the time for which the inert gas finely dispersed in the raw materials are combined with each other is shortened, so that the average diameter of the pores can be reduced.

Molding

The molding is carried out using a mold. Specifically, the raw materials (which comprises the urethane-based prepolymer, the curing agent, and the material for forming a plurality of pores) sufficiently stirred in a mixing head or the like may be injected into a mold to fill the inside thereof.

The mixture is cured to produce a molded body in the form of a solidified cake. Specifically, the reaction between the urethane-based prepolymer and the curing agent is completed in the mold, so that a molded body in the form of a solidified cake that conforms to the shape of the mold can be obtained.

Thereafter, the molded body thus obtained may be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, the height of the mold may be about 5 to about 50 times the thickness of the polishing pad to be finally produced to prepare sheets therefor. However, the sliced sheets may have pores of different diameters depending on the molded location inside the mold. That is, a sheet molded at the lower position of the mold has pores of a fine diameter, whereas a sheet molded at the upper position of the mold may have pores of a larger diameter than that of the sheet formed at the lower position.

Therefore, it is preferable to use a mold capable of producing one sheet by one molding in order for each sheet to have pores of a uniform diameter. To this end, the height of the mold may not significantly differ from the thickness of the porous polyurethane polishing pad to be finally produced. For example, the molding may be carried out using a mold having a height of 1 to 3 times the thickness of the porous polyurethane polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform diameter.

Thereafter, the top and bottom ends of the molded body obtained from the mold may be cut out, respectively. For example, each of the top and bottom ends of the molded body may be cut out by $1/3$ or less, $1/22$ to $3/10$, or $1/12$ to $1/4$ of the total thickness of the molded body.

As a specific example, the molding is carried out using a mold having a height of 1.2 to 2 times the thickness of the porous polyurethane polishing pad to be finally produced, and a further step of cutting out each of the top and bottom ends of the molded body obtained from the mold upon the molding by $1/12$ to $1/4$ of the total thickness of the molded body may then be carried out.

Subsequent to the above cutting step, the above preparation process may further comprise the steps of machining grooves on the surface of the molded body, bonding with the lower part, inspection, packaging, and the like. These steps may be carried out in a conventional manner for preparing a polishing pad.

The process for preparing a porous polyurethane polishing pad according to an embodiment can control the breakdown voltage and polishing performance (or polishing rate) of the polishing pad by adjusting the size and distribution of pores in the polishing pad thus produced.

In addition, the present invention provides a porous polyurethane polishing pad produced according to the process as described above. Specifically, the porous polyurethane polishing pad may have all of the characteristics as described above in the section of the porous polyurethane polishing pad.

EXAMPLE

Hereinafter, specific examples of the present invention will be provided. However, these examples are set forth to illustrate the present invention, and the scope of the present invention is not limited thereto.

Example 1: Preparation of a Porous Polyurethane Polishing Pad 1-1: Configuration of the Device In a casting machine equipped with feeding lines for a urethane-based prepolymer, a curing agent, and a reaction rate controlling agent, PUGL-550D (manufactured by SKC with a weight average molecular weight of 1,200 g/mole) having an unreacted NCO content of 9.1% by weight was charged to the prepolymer tank, and bis(4-amino-3-chlorophenyl)methane (manufactured by Ishihara) was charged to the curing agent tank. A reaction promoter (a tertiary amine compound supplied by Air Products under the brand name of A1) as a reaction rate controlling agent was prepared. In addition, 3 parts by weight of a first solid phase foaming agent (manufacturer: AkzoNobel, product name: Expancel 461 DET 20 d40, average particle diameter: 20 µm), 2 parts by weight of a second solid phase foaming agent (manufacturer: AkzoNobel, product name: Expancel 461 DE 40 d60, average particle diameter: 40 µm), and 0.5 part by weight of a third solid phase foaming agent (manufacturer: AkzoNobel, product name: Expancel 920 DE 40 d30, average particle diameter: 40 µm) were mixed in advance based on 100 parts by weight of the urethane-based prepolymer and charged to the prepolymer tank.

1-2: Preparation of a Sheet

The urethane-based prepolymer, the curing agent, the mixture of the first to third solid phase foaming agents, and the reaction rate controlling agent were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. The reaction rate controlling agent was fed in an amount of 1 part by weight based on 100 parts by weight of the urethane-based prepolymer.

The mixed raw materials were injected into a mold (having a width of 1,000 mm, a length of 1,000 mm, and a height of 3 mm) and solidified to obtain a sheet. Thereafter, the surface of the sheet was ground using a grinder and then grooved using a tip, to thereby prepare a porous polyurethane polishing pad having an average thickness of 2 mm.

Example 2 Preparation of a Porous Polyurethane Polishing Pad 1-1: Configuration of the Device In a casting machine equipped with feeding lines for a urethane-based prepolymer, a curing agent, a reaction rate controlling agent, and an inert gas, PUGL-550D (SKC) having an unreacted NCO content of 9.1% by weight was charged to the prepolymer tank, and bis(4-amino-3-chlorophenyl)methane (Ishihara) was charged to the curing agent tank. Nitrogen ($N_2$) as an inert gas and a reaction promoter (a tertiary amine compound manufactured by Air Products under the brand name of A1) as a reaction rate controlling agent were prepared. In addition, 2 parts by weight of a first solid phase foaming agent (manufacturer: AkzoNobel, product name: Expancel 461 DET 20 d40, average particle diameter: 20 μm) and 1 part by weight of a silicone surfactant (manufacturer: Evonik, product name: B8462) were mixed in advance based on 100 parts by weight of the urethane-based prepolymer and then charged into the prepolymer tank.

1-2: Preparation of a Sheet

The urethane-based prepolymer, the curing agent, the first solid phase foaming agent, the reaction rate controlling agent, the silicone surfactant, and the inert gas ($N_2$) were stirred while they were fed to the mixing head at constant speeds through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the inert gas was constantly fed in a volume of 25% based on the total volume of the urethane-based prepolymer, the first solid phase foaming agent, the reaction rate controlling agent, and the silicone surfactant.

The mixed raw materials were injected into a mold (having a width of 1,000 mm, a length of 1,000 mm, and a height of 3 mm) and solidified to obtain a sheet. Thereafter, the surface of the sheet was ground using a grinder and then grooved using a tip, to thereby prepare a porous polyurethane polishing pad having an average thickness of 2 mm.

Comparative Example 1 Preparation of a Porous Polyurethane Polishing Pad 1-1: Configuration of the Device In a casting machine equipped with feeding lines for a urethane-based prepolymer, a curing agent, a reaction rate controlling agent, a silicone surfactant, and an inert gas, PUGL-550D (SKC) having an unreacted NCO content of 9.1% by weight was charged to the prepolymer tank, and bis(4-amino-3-chlorophenyl)methane (Ishihara) was charged to the curing agent tank. Nitrogen ($N_2$) as an inert gas and a reaction promoter (a tertiary amine compound manufactured by Air Products under the brand name of A1) as a reaction rate controlling agent were prepared. In addition, 1 part by weight of a silicone surfactant (manufactured by Evonik under the brand name of B8462) was mixed in advance based on 100 parts by weight of the urethane-based prepolymer and then charged into the prepolymer tank.

1-2: Preparation of a Sheet

The urethane-based prepolymer, the curing agent, the silicone surfactant, and the inert gas ($N_2$) were stirred while they were fed to the mixing head at constant speeds through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the inert gas was constantly fed in a volume of 35% based on the total volume of the urethane-based prepolymer, the curing agent, and the silicone surfactant.

The mixed raw materials were injected into a mold (having a width of 1,000 mm, a length of 1,000 mm, and a height of 3 mm) and solidified to obtain a sheet. Thereafter, the surface of the sheet was ground using a grinder and then grooved using a tip, to thereby prepare a porous polyurethane polishing pad having an average thickness of 2 mm.

Test Example

The properties of the polishing pads prepared in the Examples and the Comparative Examples were measured according to the following conditions and procedures. The results are shown in Table 1 below and FIGS. 1 to 7.

(1) Specific Gravity

The polishing pad was cut into a rectangle of 4 cm×8.5 cm (thickness: 2 mm) and then allowed to stand for 16 hours under the conditions of a temperature of 23±2° C. and a humidity of 50±5%. The specific gravity of the polishing pad was measured using a gravimeter.

(2) Hardness

The Shore D hardness was measured. The polishing pad was cut into a size of 2 cm×2 cm (thickness: about 2 mm) and then allowed to stand for 16 hours under the conditions of a temperature of 25° C., 30° C., 50° C., and 70° C., respectively, and a humidity of 50±5%. Thereafter, the hardness of the polishing pad was measured using a hardness meter (D-type hardness meter).

(3) Tensile Strength

The ultimate strength immediately before the fracture was measured while the polishing pad was tested at a rate of 50 mm/min using a universal testing machine (UTM).

(4) Elongation

The same measuring method as that for tensile strength was used. The maximum deformation amount immediately before the fracture was measured, and the ratio of the maximum deformation amount to the initial length was expressed in percent (%).

(5) Average Pore Diameter, Pore Diameter Distribution, Ratio of Pore Areas, and Number of Pores The polishing pad was cut into a square of 2 cm×2 cm (thickness: 2 mm), and the image area was observed with a scanning electron microscope (SEM) at a magnification of 100 times. An image was obtained using an image analysis software, and the sizes of the entire pores were measured from the image, from which the average pore size, the pore size distribution, and the ratio of pore areas were calculated. In addition, the number of pores per unit area (1 mm$^2$) was measured from the obtained image.

Figure 1:
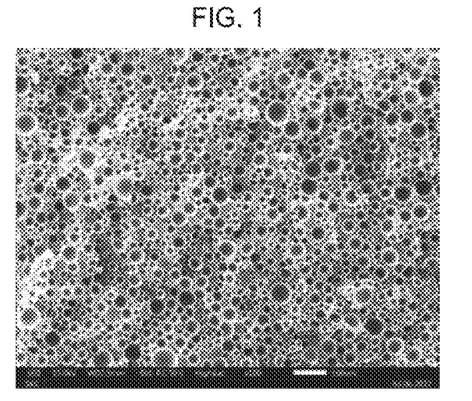
FIG. 1 is an SEM photograph of the polishing pad of Example 1.
Figure 2:
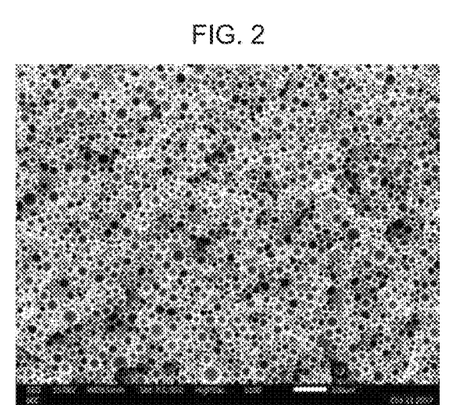
FIG. 2 is an SEM photograph of the polishing pad of Example 2.
Figure 3:
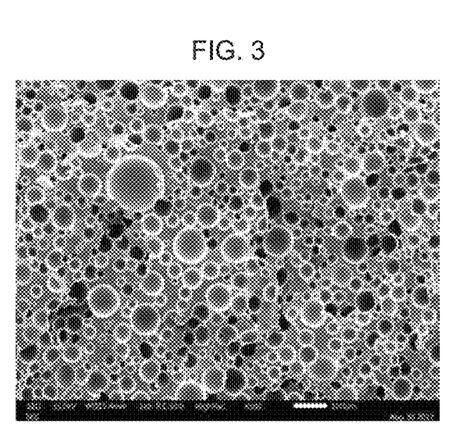
FIG. 3 is an SEM photograph of the polishing pad of Comparative Example 1.
Figure 4:
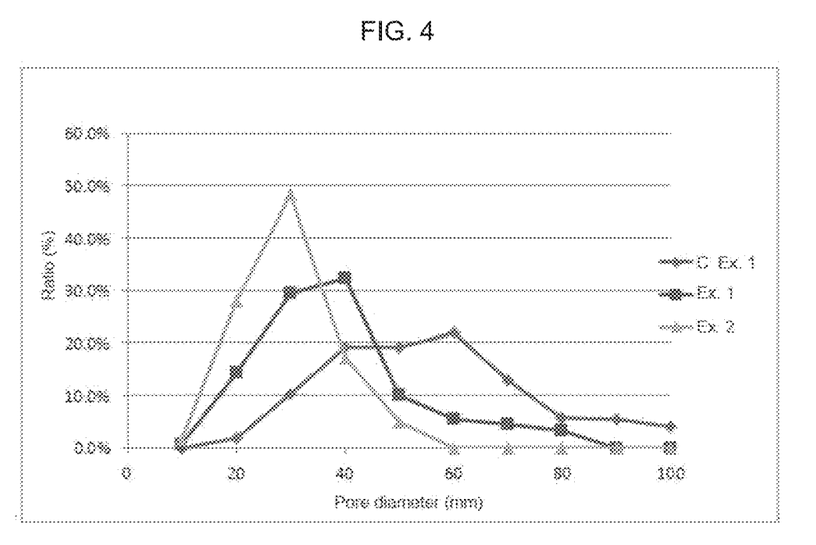
FIG. 4 is a graph showing the pore diameter distribution of each of the polishing pads of Examples 1 and 2 and that of Comparative Example 1.
Figure 7:
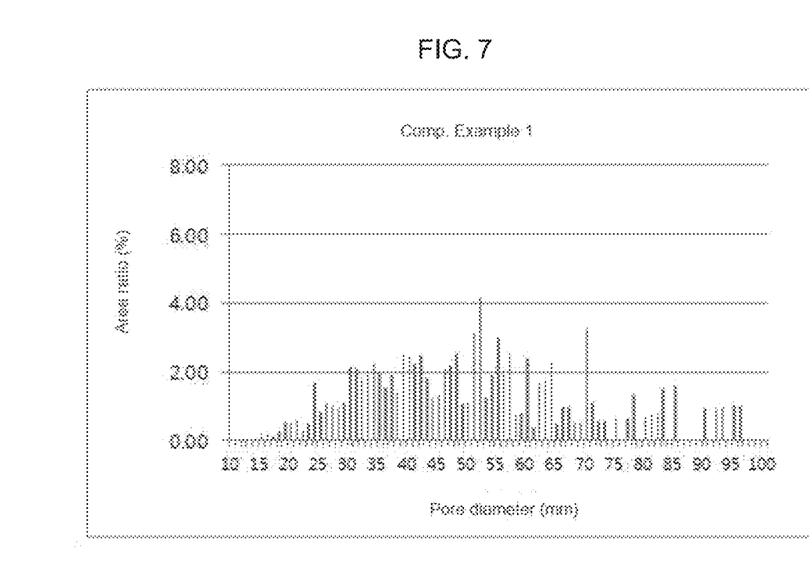

The SEM photographs of the polishing pads of Examples 1 and 2 and that of the polishing pad of Comparative Example 1 are shown in FIGS. 1 to 3, respectively. The pore diameter distribution thus calculated is shown in FIG. 4. FIGS. 5 to 7 are graphs showing the pore diameter distribution of each of the polishing pads of Examples 1 and 2 and that of Comparative Example 1 based on the area of the polishing pad, respectively.

(6) Breakdown Voltage

The breakdown voltage of 10 points was measured using SM-100BDV (model name) and 100 kV Brake Down Voltage Tester (instrument name) from SMEM Instruments, and the average value thereof was calculated.

Specifically, the 10 points mentioned above were selected as points in an interval of a width of 4 mm and a length of 4 mm on a square of 2 cm×2 cm (thickness: of 2 mm) of the polishing pad.

(7) Polishing Rate of Silicon Oxide (SiO$_x$)

A silicon wafer having a diameter of 300 mm with a silicon oxide film formed by a TEOS-plasma CVD method was set on the porous polyurethane polishing pad mounted on the platen in a CMP polishing machine, while the silicon oxide film of the silicon wafer faced downward. Thereafter, the silicon oxide film was polished under a polishing load of 1.4 psi while the silicon wafer was rotated at a speed of 121 rpm, the platen was rotated at a speed of 115 rpm for 60 seconds, and a calcined silica slurry was supplied on the polishing pad at a rate of 190 ml/min. Upon completion of the polishing, the silicon wafer was detached from the carrier, mounted in a spin dryer, washed with purified water (DIW), and then dried with air for 15 seconds. The film thickness of the dried silicon wafer was measured before and after the polishing using a spectral reflectometer type thickness measuring instrument, and the polishing rate was calculated therefrom. The polishing rates of the polishing pads of Example 1 and Comparative Example 1 were calculated based on the polishing rate of Example 2 as 100%.

TABLE 1

|  | C. Ex. 1 | Ex. 1 | Ex. 2 |
|---|---|---|---|
| Specific gravity (g/cm$^3$) | 0.817 | 0.801 | 0.812 |
| Hardness at 25° C. (Shore D) | 58 | 58 | 59 |
| Hardness at 30° C./50° C./70° C. (Shore D) | 58/53/49 | 57/53/46 | 59/55/49 |
| Tensile strength (N/mm$^2$) | 22.4 | 21.1 | 21.0 |
| Elongation (%) | 127 | 99 | 115 |
| Modulus (N/mm$^2$) | 60 | 113 | 85 |
| Area-weighted average pore diameter (μm) | 50.6 | 35 | 24.6 |
| Pore diameter of the maximum peak (μm) | 52 | 33 | 26 |
| Number of pores (ea/mm$^2$) | 417 | 906 | 1410 |
| Breakdown voltage (kV) | 13 kV | 17.5 kV | 21.2 kV |
| Polishing rate of silicon oxide (SiO$_x$) (%) | 55 | 80 | 100 |

As shown in Table 1, the polishing pads of Examples 1 and 2 had smaller average pore sizes and larger numbers of pores per unit area than those of the polishing pad of Comparative Example 1. Thus, they had high breakdown voltages and polishing rates of silicon oxide. In addition, the polishing pads of Examples 1 and 2 had appropriate breakdown voltages as compared with the polishing pad of Comparative Example 1.

The invention claimed is:

1. A porous polyurethane polishing pad, which is prepared from a reaction mixture comprising a urethane-based prepolymer and a curing agent,
    wherein the porous polyurethane polishing pad comprises a plurality of pores,
    wherein in a cross-sectional area of the polishing pad of 2 cm×2 cm and 2 mm thick the plurality of pores have an area-weighted average pore diameter (AWAPD) of 10 μm to 40 μm,
    wherein in the pore size distribution of the plurality of pores based on a cross-sectional area of the polishing pad, a sum of cross-sectional areas of pores having a diameter of greater than X+10 μm is 5% to 20% based on 100% of a sum of the cross-sectional areas of the plurality of pores, and X equals the AWAPD,
    wherein in the pore size distribution of the plurality of pores based on the cross-sectional area of the polishing pad, the pore diameter of the maximum peak Y is 15 μm to 40 μm, and wherein a sum of cross-sectional areas of pores having a diameter of Y−5 μm or less is 20% to 40% based on 100% of the sum of the cross-sectional areas of the plurality of pores, and
    wherein the porous polyurethane polishing pad has a thickness of 1.5 mm to 2.5 mm, a specific gravity of 0.7 g/cm$^3$ to 0.9 g/cm$^3$, a surface hardness at 25° C. of 50 shore D to 65 shore D, a tensile strength of 15 N/mm$^2$ to 25 N/mm$^2$, an elongation of 80% to 250%, a total pore area of 30% to 60% based on the total area of the polishing pad, and a breakdown voltage of 14 kV to 23 kV.

2. The porous polyurethane polishing pad of claim 1, wherein a sum of cross-sectional areas of first pores having a diameter of less than X−5 μm is 5% to 45%, and a sum of cross-sectional areas of second pores having a diameter of greater than X+5 μm is 10% to 45%, based on 100% of the sum of the cross-sectional areas of the plurality of pores.

3. The porous polyurethane polishing pad of claim 1, wherein the reaction mixture further comprises a reaction rate controlling agent.

4. The porous polyurethane polishing pad of claim 3, wherein the reaction rate controlling agent comprises at least one selected from the group consisting of triethylene diamine (TEDA), dimethyl ethanol amine (DMEA), tetramethyl butane diamine (TMBDA), 2-methyl-triethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide.

5. The porous polyurethane polishing pad of claim 1, wherein the curing agent comprises an amine compound, an alcohol compound, or a combination thereof.

6. The porous polyurethane polishing pad of claim 1, which has a number of pores of 500 or more per unit area of 1 mm$^2$ thereof.

7. The porous polyurethane polishing pad of claim 1, wherein the plurality of pores are derived from a mixture of at least two solid phase foaming agents or from at least one solid phase foaming agent and at least one inert gas.

8. The porous polyurethane polishing pad of claim 7, wherein the mixture of solid phase foaming agents is a mixture of at least two solid phase foaming agents having different average particle diameter distributions.

9. A process for preparing a porous polyurethane polishing pad, which comprises:
   (1) injecting a mixture comprising a urethane-based prepolymer, a curing agent, and a material for forming a plurality of pores into a mold and molding the mixture; and
   (2) curing the mixture,
   wherein in a cross-sectional area of the polishing pad of 2 cm×2 cm and 2 mm thick the plurality of pores have an area-weighted average pore diameter (AWAPD) of 10 μm to 40 μm,
   wherein in the pore size distribution of the plurality of pores based on a cross-sectional area of the polishing pad, a sum of cross-sectional areas of pores having a diameter of greater than X+10 μm is 5% to 20% based on 100% of a sum of the cross-sectional areas of the plurality of pores, and X equals the AWAPD,
   wherein in the pore size distribution of the plurality of pores based on the cross-sectional area of the polishing pad, the pore diameter Y of the maximum peak is 15 μm to 40 μm, and wherein a sum of cross-sectional areas of pores having a diameter of Y−5 μm or less is 20% to 40% based on 100% of the sum of the cross-sectional areas of the plurality of pores, and
   wherein the porous polyurethane polishing pad has a thickness of 1.5 mm to 2.5 mm, a specific gravity of 0.7 g/cm$^3$ to 0.9 g/cm$^3$, a surface hardness at 25° C. of 50 shore D to 65 shore D, a tensile strength of 15 N/mm$^2$ to 25 N/mm$^2$, an elongation of 80% to 250%, a total pore area of 30% to 60% based on the total area of the polishing pad, and a breakdown voltage of 14 kV to 23 kV.

10. The process for preparing a porous polyurethane polishing pad of claim 9, wherein the material for forming the plurality of pores is a mixture of at least two solid phase foaming agents, or at least one solid phase foaming agent and at least one inert gas.

11. The process for preparing a porous polyurethane polishing pad of claim 10, wherein the mixture of solid phase foaming agents is a mixture of at least two solid phase foaming agents having different average particle diameter distributions.

12. The process for preparing a porous polyurethane polishing pad of claim 9, wherein the mixture further comprises a reaction rate controlling agent, and
   the reaction rate controlling agent is at least one selected from the group consisting of a tertiary amine-based compound and an organometallic compound.

13. The process for preparing a porous polyurethane polishing pad of claim 12, wherein the reaction rate controlling agent comprises at least one selected from the group consisting of triethylene diamine (TEDA), dimethyl ethanol amine (DMEA), tetramethyl butane diamine (TMBDA), 2-methyl-triethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N, N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide.

14. The process for preparing a porous polyurethane polishing pad of claim 9, wherein a sum of cross-sectional areas of first pores having a diameter of less than X−5 μm is 5% to 45%, and a sum of cross-sectional areas of second pores having a diameter of greater than X+5 μm is 10% to 45%, based on 100% of the sum of the cross-sectional areas of the plurality of pores.

* * * * *